United States Patent [19]
Byers et al.

[11] Patent Number: 5,394,443
[45] Date of Patent: Feb. 28, 1995

[54] MULTIPLE INTERVAL SINGLE PHASE CLOCK

[75] Inventors: Larry L. Byers, Apple Valley; Randy L. DeGarmo, Oakdale, both of Minn.

[73] Assignee: Unisys Corporation, Blue Bell, Pa.

[21] Appl. No.: 173,733

[22] Filed: Dec. 23, 1993

[51] Int. Cl.[6] .............................................. H04L 7/04
[52] U.S. Cl. ................................ 375/371; 370/105.3; 375/373; 327/141; 327/258; 327/295
[58] Field of Search .............................. 375/106–108, 375/110, 118, 119; 370/100.1, 105.3, 105.5; 307/480, 269, 510–513; 328/62–63; 377/78, 80

[56] References Cited

U.S. PATENT DOCUMENTS

| | | | |
|---|---|---|---|
| 3,921,079 | 11/1975 | Heffner et al. | 375/107 |
| 4,654,599 | 3/1987 | Zbinden et al. | 328/62 |
| 4,692,932 | 9/1987 | Denhez et al. | 375/108 |
| 4,833,695 | 5/1989 | Greub | 375/118 |
| 4,847,516 | 7/1989 | Fujita et al. | 307/269 |
| 5,133,064 | 7/1992 | Hotta et al. | 395/550 |

Primary Examiner—Stephen Chin
Assistant Examiner—Young Tse
Attorney, Agent, or Firm—Steven R. Funk; Charles A. Johnson; Mark T. Starr

[57] ABSTRACT

A multiple phase clock distribution system for allowing a circuit load to be clocked on predetermined phases of a single clock signal is provided. A single phase clock is the triggering signal for each circuit load in the system, and enable signals are provided to each circuit load to allow the single phase clock to be recognized at only upon an active logic level of the chosen enable signal at a particular circuit load. The enable signals are of duration equal to one period of the single phase clock, and are activated nearly one period of the single phase clock before the triggering edge of the clock to provide as long of an enable signal stabilization period as possible before the single phase clock transitions to its active logic level. Enable signal combination circuitry exists to combine individual enable signals so that varying-frequency enable signals can be produced, and can therefore emulate a multiple phase clock regardless of the number of phases desired. Error detection circuitry is provided to ensure proper operation of the circuitry generating the enable signals.

25 Claims, 11 Drawing Sheets

| 188 CLKEN1-A | 190 CLKEN1-B | 192 CLKEN1-C | 194 CLKEN1-D | 290 XNOR10 OUTPUT | 280 CLKFLT |
|---|---|---|---|---|---|
| 0 | 0 | 0 | 0 | 1 | ACTIVE |
| 0 | 0 | 0 | 1 | 0 | INACTIVE |
| 0 | 0 | 1 | 0 | 0 | INACTIVE |
| 0 | 0 | 1 | 1 | 1 | ACTIVE |
| 0 | 1 | 0 | 0 | 0 | INACTIVE |
| 0 | 1 | 0 | 1 | 1 | ACTIVE |
| 0 | 1 | 1 | 0 | 1 | ACTIVE |
| 1 | 0 | 0 | 0 | 0 | INACTIVE |
| 1 | 0 | 0 | 1 | 1 | ACTIVE |
| 1 | 0 | 1 | 0 | 1 | ACTIVE |
| 1 | 1 | 0 | 0 | 1 | ACTIVE |

FIG. 13

| 282 CLKEN2-A | 284 CLKEN2-B | 286 CLKEN2-C | 288 CLKEN2-D | 292 XNOR9 OUTPUT | 280 CLKFLT |
|---|---|---|---|---|---|
| 0 | 0 | 0 | 0 | 1 | ACTIVE |
| 0 | 0 | 0 | 1 | 0 | INACTIVE |
| 0 | 0 | 1 | 0 | 0 | INACTIVE |
| 0 | 0 | 1 | 1 | 1 | ACTIVE |
| 0 | 1 | 0 | 0 | 0 | INACTIVE |
| 0 | 1 | 0 | 1 | 1 | ACTIVE |
| 0 | 1 | 1 | 0 | 1 | ACTIVE |
| 1 | 0 | 0 | 0 | 0 | INACTIVE |
| 1 | 0 | 0 | 1 | 1 | ACTIVE |
| 1 | 0 | 1 | 0 | 1 | ACTIVE |
| 1 | 1 | 0 | 0 | 1 | ACTIVE |

FIG. 14

MULTIPLE INTERVAL SINGLE PHASE CLOCK

BACKGROUND OF THE INVENTION

1. Field of the Invention

This invention relates to multiple phase digital clocking, and more particularly to clock distribution of a single phase clock source with multiple phase clock enabling.

2. Description of the Prior Art

Modern digital circuitry and computer systems often require the use of synchronous clock distribution systems. Synchronous systems are digital systems where the operations are controlled by continuous, periodic clock pulses. The known frequency of the clock pulses allows activity within the system to occur at a fixed time relative to the clock pulses. Synchronous systems utilize registers, or flip-flops, to control the timing of digital operations by latching data in or sending data out on the occurrence of a clock pulse transition. This allows for the stabilization of component set-up times or other desired timing requirements without the use of handshake lines, as required in most asynchronous systems.

The use of a single clock pulse for timing the digital activity in a system creates difficulties where activities are not required on each consecutive clock pulse. Situations may arise where it is not desirable to clock a circuit load on every clock pulse, but rather to clock it on only specified clock pulses. For instance, a circuit load may only require clocking on every other system clock pulse, or every fourth clock pulse, and so on. This can be accomplished by serial-in, parallel-out shift registers, such as in U.S. Pat. No. 4,847,516, by Fujita et al., issued Jul. 11, 1989. In Fujita et al., a shift register generates a plurality of clock signals of varying phases to clock a logic circuit. However, where numerous shift registers are used to produce an equal number of sets of multiphase clock signals, clock skew problems can arise. Each phase from a shift register would have to be synchronized with the corresponding phase from the other shift registers to ensure synchronized clocking of the loads. In other words, phase 1 of the first shift register is clocking its load with circuitry which is totally independent from the circuitry clocking other loads. Therefore, in Fujita et al., synchronized clocking of the loads in separate load units cannot be assured without synchronizing the corresponding phases of each shift register.

A similar circuit to the Fujita et al. circuit has been implemented in U.S. Pat. No. 5,133,064, by Hotta et al., issued Jul. 21, 1992. This circuit also provides multiple phase clock signals which directly drive the circuit loads, so that certain circuit loads in the system are clocked by different triggering edges of corresponding phases of the multiple phase clock generators. A four phase clock signal generator is shown in U.S. Pat. No. 4,654,599, by Zbinden et al., issued Mar. 31, 1987 again generates multiple phases of the clock signal itself, and these generated clock phases then perform the actual clocking of the circuit loads.

To overcome clock skew problems and associated synchronization complications, the present invention uses a single system clock signal as the triggering clock input on each load in the entire system, and multiple phase enable signals to permit the load to accept the system clock signal at predetermined phases of the system clock signal. Rather than create a plurality of multiple phase clock signals to clock the loads directly, the multiple phase enable signals will notify the loads as to when to accept the common system clock signal which is always present at its clock input. This ensures that each load which is enabled will be clocked on the same triggering edge as each of the other loads. The enable signal can be constructed so that its frequency is half the frequency of the system clock, and the enable signal is activated nearly one period of the system clock before the triggering edge of the system clock. Therefore, the enable signal is activated long before the triggering edge of the system clock to allow a time approximately equal to one period of the system clock for the enable signal to stabilize. It is not the rising or falling "edge" of the enable signals that trigger clocking of the circuit loads, but rather it is the presence or absence of the logic "level" at the time of the occurrence of a triggering system clock pulse which is controlling. This alleviates skew problems, as there is allowance for fluctuation in corresponding enable signals. The skew control for the multiple phase enable signals is therefore quite relaxed compared to the skew control where multiple phase clock signals are used.

In Hotta et al., tri-state buffers are used to enable the clock signals. This is not to be confused with the clock enabling of the present invention. In the present invention, the system clock provides the triggering edge to each of the loads, and the multiple phase enable signals enable the load to receive the system clock signal. In Hotta et al., the multiple phase clock signals provide the triggering edge to the loads, and the tri-state enables only enable or disable the transmission of the clock signals themselves. Hotta et al. describes these tri-state enables as being used as a clock driver circuit for supplying the clock signals, and the tri-state enables are enabled or disabled to conduct diagnostic operations. Therefore, the Hotta et al. design does not reach the desired effect of the present invention, which is to have a single system clock source provide the triggering edge to each circuit load, and to provide multiple phase enable signals which do not provide the actual triggering edge, but only allow the system clock signal to be recognized at the load.

The present invention also allows the logic loads to be clocked at different frequencies of the single phase clock. Depending on the circuit load, it may be desirable to clock the load on every cycle of the system clock signal, or every other cycle of the system clock signal, or every fourth cycle of the system clock signal, and so forth. If a four-phase system were desired, a system generating a four-phase enable signal would provide a load with a triggering edge on every fourth cycle of the system clock signal if connected to one of the four phases. However, some loads may require triggering on every second system clock signal. The present invention accommodates this by providing logical combinations of the four phase enable signals. For instance, phase 1 and phase 3 of the four-phase enable signals could be logically ORed together to produce a two-phase enable signal. This can be easily accomplished using the enable signals rather than attempting to combine the actual clock signals which provide the triggering edges to the loads. In a system which uses the generated phases themselves as the triggering edge to clock circuit loads, a further combination of the phases would introduce more skew than would already be present. By combining the enable signals rather than the clock signals themselves, the system clock signal would still provide the triggering edge, and the enable signals could be combined to change the rate at which a load would accept the triggering edges. Skew considerations are relatively minor where the enable signals are combined rather than the actual clock signals, because there is some flexibility as to when the enable signals must be present at the load, as previously described.

The present invention provides a multiple phase distribution system using a common system clock as the triggering edges for all loads. This greatly reduces the complexity in synchronization of circuit load activity, since only the common system clock requires precise synchronization at the loads, rather than synchronizing each corresponding phase of a multiple phase clock at the loads. The multiple enable signals allow for less restrictive skew considerations, due to the close proximity of the enable signal generator to the loads, and more particularly due to the presence of the enable signal one-half period prior to and following the triggering edge of the system clock. The ability of the present invention to allow for the relatively skew-free combination of multiple phases provides greater flexibility and control of circuit load activity. The present invention therefore overcomes the complexities in skew correction of the prior art, and provides for a more flexible and accurate clocking system.

OBJECTS

It is a primary objective of this invention to provide an improved multiple phase clock distribution system.

It is another object of the present invention to provide a multiple phase clock distribution system with reduced distribution complexities.

It is yet another object to provide a multiple phase clock distribution system with reduced clock skew concerns.

It is a further object of the present invention to provide phase enable circuitry to generate a plurality of enable signals which are generated from the clock signal.

Another object of this invention is to provide an enable signal generation circuit that provides multiple clock interval periods to satisfy system component speeds.

It is another object of the invention to provide enable signal combination circuitry to produce combinations of individual enable signals in order to create combined enable signals having frequencies greater than that of the selected individual enable signals.

It is yet another object of the present invention to provide active enable signals and combined enable signals of duration equal to one pulse of the driving clock signal, and having the active enable signals and combined enable signals activated and stabilized before the occurrence of the triggering edge of the driving clock signal so that a stabilization period nearly equal to one period of the driving clock signal exists for the enable signals and combined enable signals before the triggering edge of the driving clock signal occurs.

It is a further object of the invention to provide error detection circuitry to ensure proper operation of the phase enable circuitry.

It is yet another object of the invention to provide a single clock to each circuit load in the system, and to allow each circuit load to be clocked upon receipt of one of the enable signals or one of the combined enable signals.

Other more detailed objectives will become apparent from a consideration of the Drawings and the Detailed Description of the Preferred Embodiment.

SUMMARY OF THE INVENTION

The Multiple Interval Single Phase Clock provides the functionality of a multiple phase clock, while greatly reducing distribution complexities and skew concerns. The present invention allows the circuit loads to be clocked at specific intervals, or phases, of a single driving clock signal. Only one clock signal needs to be distributed, and enable signals derived from the clock signal are generated at the circuit loads to produce the same result as that of a clock distribution system which distributes multiple phases of a clock signal to circuit loads.

One aspect of the present invention uses a synchronization signal which is derived from the single phase system clock signal to generate multiple phase enable signals at the circuit loads. This synchronization signal occurs every n-th period of the clock signal, where n equals a predetermined whole number, and has a duration equal to one period of the clock signal. Clock sourcing circuitry generates the system clock signal and the synchronization signal. Phase enabling circuitry receives the synchronization signal, and generates enable signals in response to the synchronization signal. The number of enable signals generated is dependent upon the number of phases which are desired. For instance, in accordance with one aspect of the invention, four enable signals are generated, each of duration equal to one period of the clock signal, and each providing an active logic level at a time when no other enable signal is at an active logic level. Therefore, each phase of each enable signal occurs every fourth pulse of the clock signal non-concurrently with the other enable signals. An enable signal is then coupled to each circuit load. In this way, the particular circuit load will be enabled to receive the triggering clock pulse when its enable signal is at an active logic level.

In accordance with another aspect of the invention, the enable signals are combined in various combinations to produce enable signals of various frequencies. For instance, two or more individual enable signals can be combined using logical OR gates to produce enable signals having two or more times the frequency of an individual enable signal, up to the point where the combined enable signal is at a constant active logic level in which the triggering clock signal would be constantly enabled. The circuitry which produces the combinations of enable signals allows the single phase clock signal to emulate a variety of multiple phase clock distribution systems.

Clock skew concerns are greatly diminished through the use of the enable signals versus the distribution of multiple phases of the clock signal itself. Where multiple phases of the clock signal are generated and distributed, each phase must be controlled to alleviate skew before triggering its respective circuit load. The present invention only requires the control of the single phase clock signal itself, and the enable signals do not require such tight skew control. This is accomplished by creating enable signals of duration equal to one period of the triggering clock signal, and providing a time equal to approximately one period of the single phase clock signal for the enable signals to stabilize before the triggering edge of the clock signal. The enable signal need only be stabilized at the time of the triggering edge of the clock signal, and will have just under one period of the clock signal to attain this stabilization. Therefore, the tight skew control which would be required for distributing multiple phases of the clock signal is not required for distribution of the enable signals. Furthermore, since the phase enabling circuitry can be physically located near the circuit loads, inherent timing problems are greatly reduced.

In accordance with another aspect of the invention, enable signal error detection circuitry is provided to monitor the enable signals, and ensure proper enable signal function. One test ensures that only one enable signal of the total number of enable signals is at an active logic level at a time. The enable signals are designed so that none of the enable signals are activated concurrently, and concurrent active logic levels on two or more enable signals would indicate an error within the phase enable circuitry. An error indication will therefore occur if none of the enable signals are set, or if one of the enable signals is set when it should not be set.

A second test is used to ensure that corresponding phases from two phase enable circuits are occurring simultaneously. Two phase enable circuits are used in the present invention to accommodate the fanout requirements of the system and to reduce accumulative skew effects. Therefore, a phase-to-phase comparison is performed, and an error indication will occur if the logic levels for each of the corresponding phases are not continuously equal.

Still other objects and advantages of the present invention will become readily apparent to those skilled in this art from the following detailed description, where the preferred embodiment of the invention is shown by way of illustration of the best mode contemplated of carrying out the invention. As will be realized, the invention is capable of other and different embodiments, and its details are capable of modification without departing from the invention. Accordingly, the drawing and description are to be regarded as illustrative in nature, and not as restrictive.

BRIEF DESCRIPTION OF THE DRAWINGS

FIG. 13 is a table showing scenarios which will cause a Clkflt to occur in Clock Enable Generation Module 1 during an Enable Signal Set Test;

FIG. 14 is a table showing scenarios which will cause a Clkflt to occur in Clock Enable Generation Module 2 during an Enable Signal Set Test.

DETAILED DESCRIPTION OF THE PREFERRED EMBODIMENT

Figure 1:
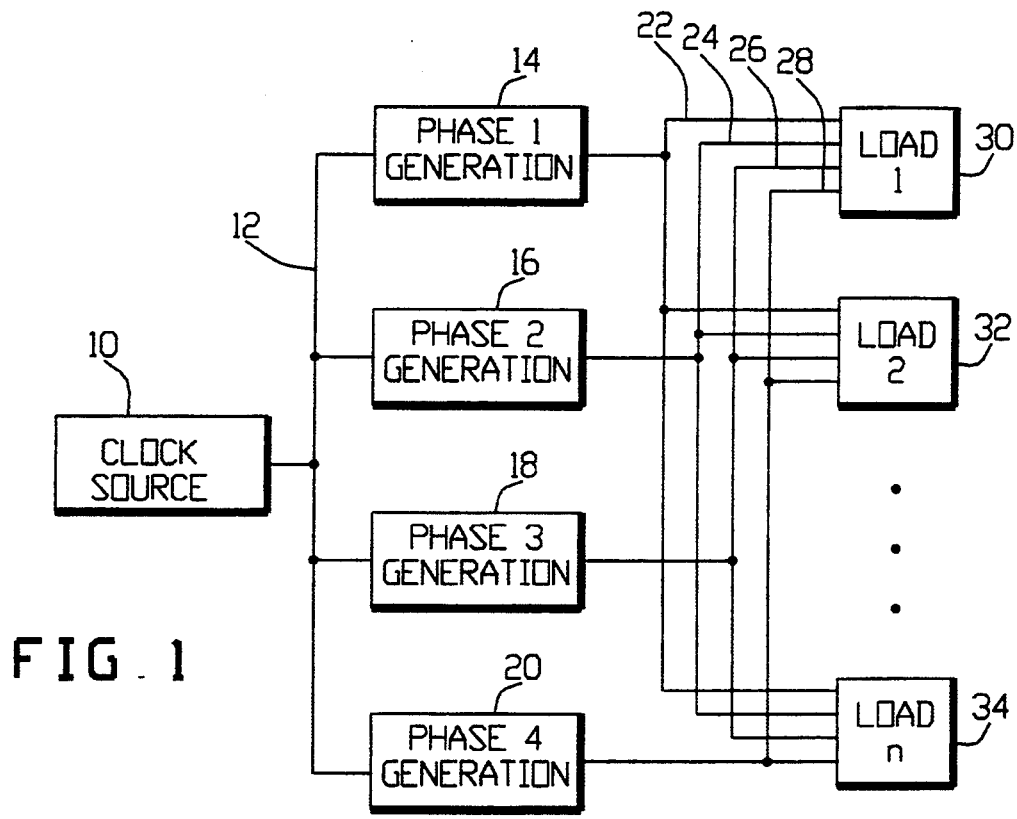
FIG. 1 is a block diagram of the generation and distribution of four phases of a system clock.

FIG. 1 is a block diagram of the generation and distribution of four phases of a system clock. This diagram shows how multiple phase clock distribution systems are known to have been implemented. Clock Source 10 produces a single phase clock signal, labeled Clock Signal 12, and supplies this Clock Signal to Phase 1 Generation 14, Phase 2 Generation 16, Phase 3 Generation 18, and Phase 4 Generation 20. These phase generators each produces a waveform which consists of one clock pulse for every four clock pulses of the Clock Signal 12. Each clock pulse from each phase generator is shifted in time one clock pulse of the Clock Source from any of the other three clock pulses from their respective phase generators. This produces four waveforms with 12.5% duty cycles, each shifted in time with respect to the others. Phase 1 Generation 14 produces Clock Phase 1 22, Phase 2 Generation 16 produces Clock Phase 2 24, Phase 3 Generation 18 produces Clock Phase 3 26, and Phase 4 Generation 20 produces Clock Phase 4 28. Each of the four Clock Phases supplies each circuit load in the system, labeled Load 1 30, Load 2 32 through Load n 34. Each given circuit load may have components utilizing different phases of the Clock Signal 12 by connection to one of the four Clock Phases.

This type of multiple phase clock distribution system supplies phases of the Clock Signal 12 to each load. If Loads 1 30 and 2 32 through n 34 are to operate synchronously with each other, each of the generated phases of the clock from the Phase 1 Generation 14, Phase 2 Generation 16, Phase 3 Generation 18, and Phase 4 Generation 20 must be monitored to maintain synchronization and minimize clock skew with the Clock Signal 12. This skew must be tightly controlled, and would require a considerable amount of phase detection and synchronization circuitry. Further, each phase of the clock signal at each load must be tightly controlled so that each load is clocked at precisely the same time. This can become a difficult task where multiple phases of a clock are clocking multiple circuit loads at different physical locations in the system.

Figure 2:
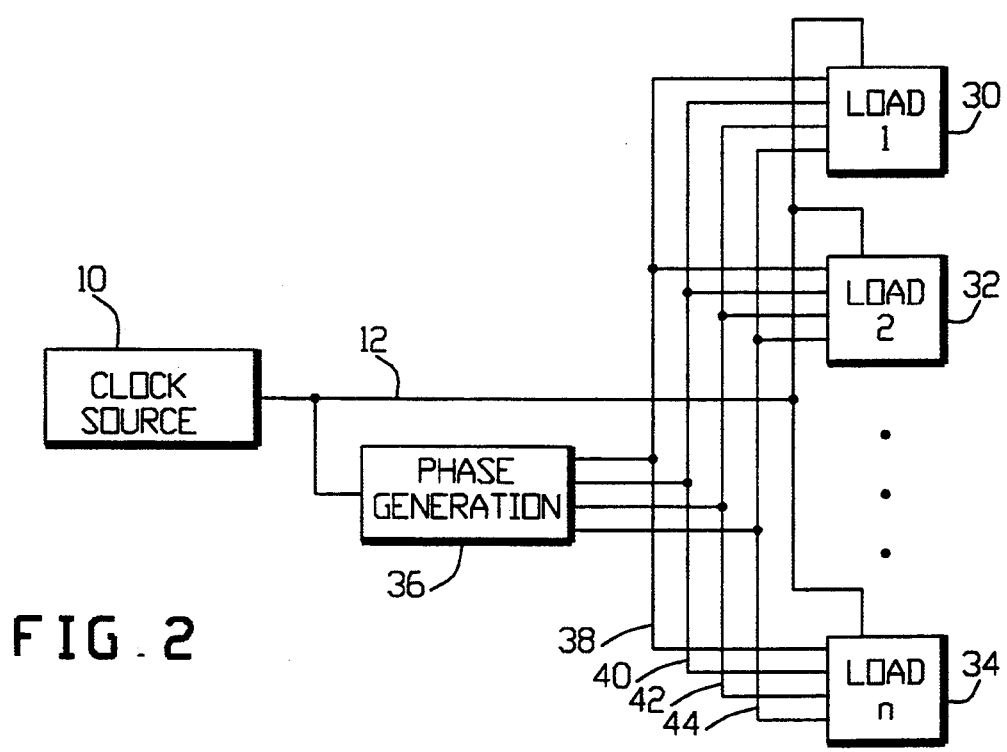
FIG. 2 is a block diagram of the single phase clock with multiple phase enables of the present invention.

FIG. 2 is a block diagram of the single phase clock with multiple phase enables of the present invention. Clock Source 10 provides a single phase Clock Signal 12 to each of the circuit loads, including Load 1 30, Load 2 32, through Load n 34. To allow the Loads to be clocked on multiple phases of the Clock Signal 12, Phase Generation 36 circuitry is provided. This circuitry receives the Clock Signal from the Clock Source, and provides four enable signals, Enable Signal 1 38, Enable Signal 2 40, Enable Signal 3 42, and Enable Signal 4 44 to each of the Loads. Therefore, the Clock Signal itself clocks each Load, but only when the appropriate Enable Signal allows that Load to accept the Clock Signal.

The configuration of the present invention only requires the tight control of one signal, which is the Clock Signal 12 from the Clock Source 10. This is favorable to systems which use multiple clock phase generators, since clock skew due to differences in physical clock signal connections and component tolerances create difficulties in clock regulation. The Enable Signals 1 38, 2 40, 3 42, and 4 44 enable the Loads 1 30, 2 32 through n 34 to accept the clock signal with a logic level and are not edge triggering signals. Therefore, the skew control of the Enable Signals is much more relaxed than that of a multiple phase clock, where the transition edges of the clock phases themselves perform the actual clocking. The use of Enable Signals also allows for combinations of the Enable Signals, i.e., the Enable Signals may be "ORed" together to produce Enable Signals of various frequencies. This can be performed simply, and without the need for additional strict skew control.

It should be noted that although the preferred embodiment generates a four-phase clock enable, this number is theoretically unlimited, and could be lowered or raised depending upon the requirements of the circuit loads and the system to be designed. The foregoing conceptual description of the present invention will be discussed in more detail in the ensuing description.

Figure 3:
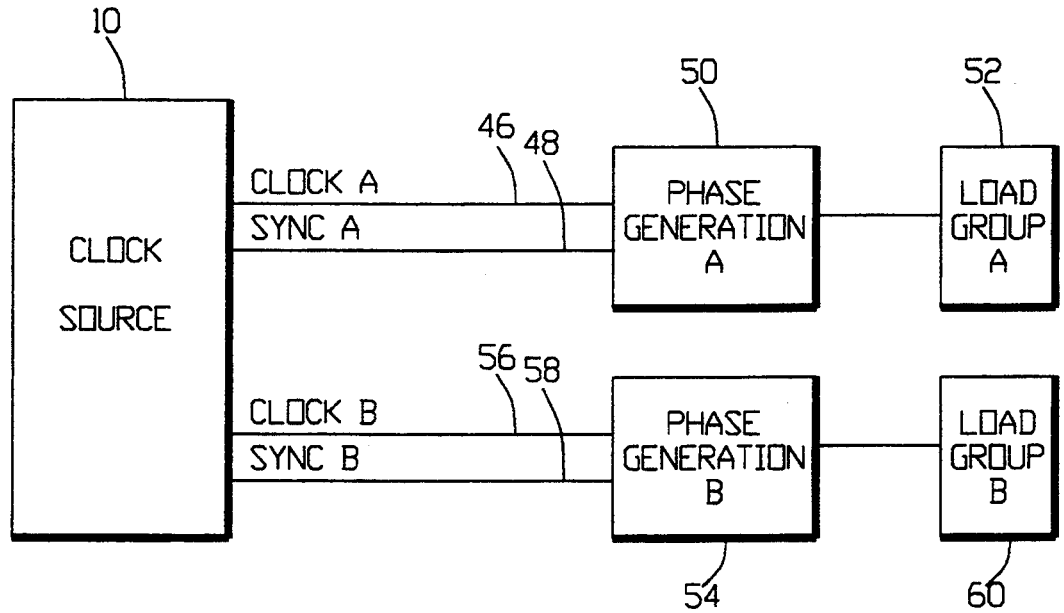
FIG. 3 shows the composition of a Clock Signal of FIG. 2.

FIG. 3 shows the composition of a Clock Signal 12 of FIG. 2. The Clock Signal of FIG. 2 comprises a clock signal and a synchronization signal, labeled Clock A 46 and Sync A 48 generated from the Clock Source 10. Clock A is the free-running clock which is the actual clock signal for the system. Sync A is a synchronization signal which is used to produce the Enable Signals 1 38, 2 40, 3 42, and 4 44 that provide multiple phases of Clock A. Clock A 46 and Sync A 48 enter Phase Generation A 50 which includes all circuitry necessary to produce multiple phase Enable Signals and to deliver Clock A 46 to the Load Group A 52 comprising Load 1 30, Load 2 32 through Load n 34 of FIG. 2.

In FIG. 3, a second phase generation circuit, labeled Phase Generation B 54, is shown. This circuit accepts a second clock signal set, comprising Clock B 56 and Sync B 58. This second clock signal set may be used, as was used in the preferred embodiment, to clock a second Load Group B 60. It is possible to continue to add more Phase Generation circuits if it is necessary to clock more Load Groups. In the system clocked by the preferred embodiment, the two Load Groups represent redundant Loads, i.e., Load Group B 60 is a duplicate of Load Group A 52. Each Load Group is clocked by a separate Clock and Sync signal, which allows one Load Group to continue operating in the event that the other Load Group's Clock and Sync signals fail. The Clock A 46 and Clock B 56 signals must be synchronized in such a case, as was also done in the preferred embodiment.

Figure 4:
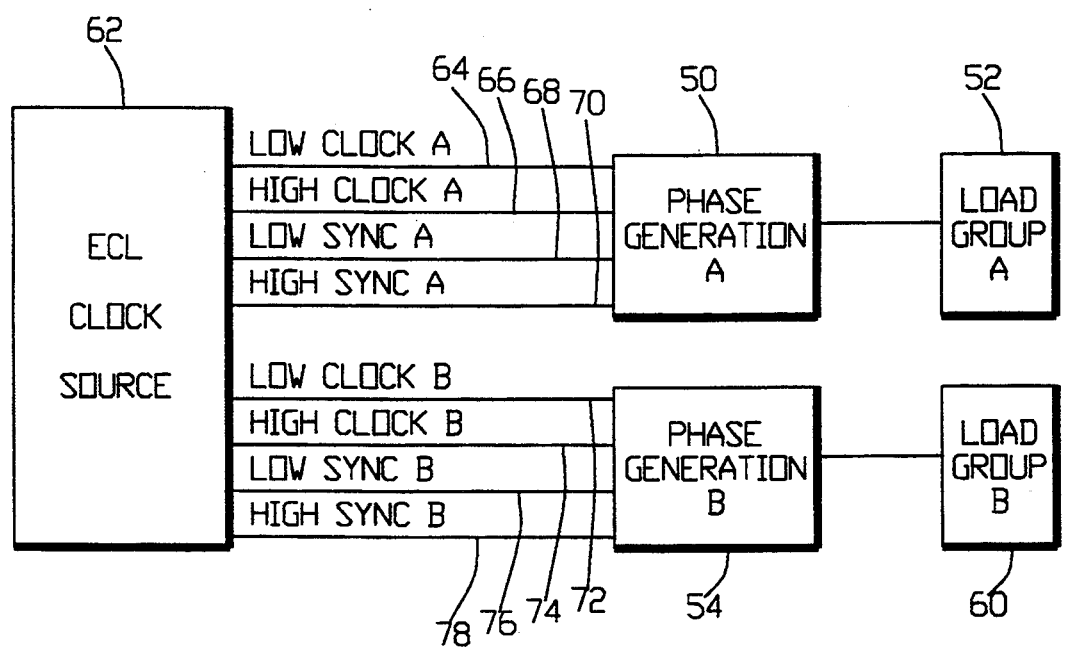
FIG. 4 shows the composition of the Clock Signal of FIG. 2 for the preferred embodiment of the present invention.

FIG. 4 shows the composition of the Clock Signal 12 of FIG. 2 for the preferred embodiment of the present invention. In the preferred embodiment, the ECL Clock Source 62 drives differential ECL (Emitter-Coupled Logic) signals to Phase Generation A 50 and Phase Generation B 54. The Phase Generation circuitry drives Load Group A 52 and Load Group B 60, just as in FIG. 3. The only difference in the preferred embodiment is that differential ECL signals are used. The signals from the ECL Clock Source 62 driving Phase Generation A 50 are Low Clock A 64, High Clock A 66, Low Sync A 68, and High Sync A 70. Phase Generation A consists of ECL to TTL translation circuitry, which will convert the differential signals to a single Clock A and Sync A signal, as in FIG. 3. Likewise, the signals from the ECL Clock Source 62 driving Phase Generation B 54 are Low Clock B 72, High Clock B 74, Low Sync B 76, and High Sync B 78, and Phase Generation B also consists of ECL to TTL translators. The use of differential ECL signals, and the use of ECL to TTL translation is not pertinent to the operation of this invention, and therefore the remaining description will refer to only one clock and one sync signal per Phase Generation circuit, rather than the high and low clock and sync signals that comprise differential ECL signals. For more information regarding the generation and synchronization of Clock A 46, Sync A 48, Clock B 56, and Sync B 58, see copending patent application Ser. No 08/172,661, filed on Dec. 23, 1993.

Figure 5:
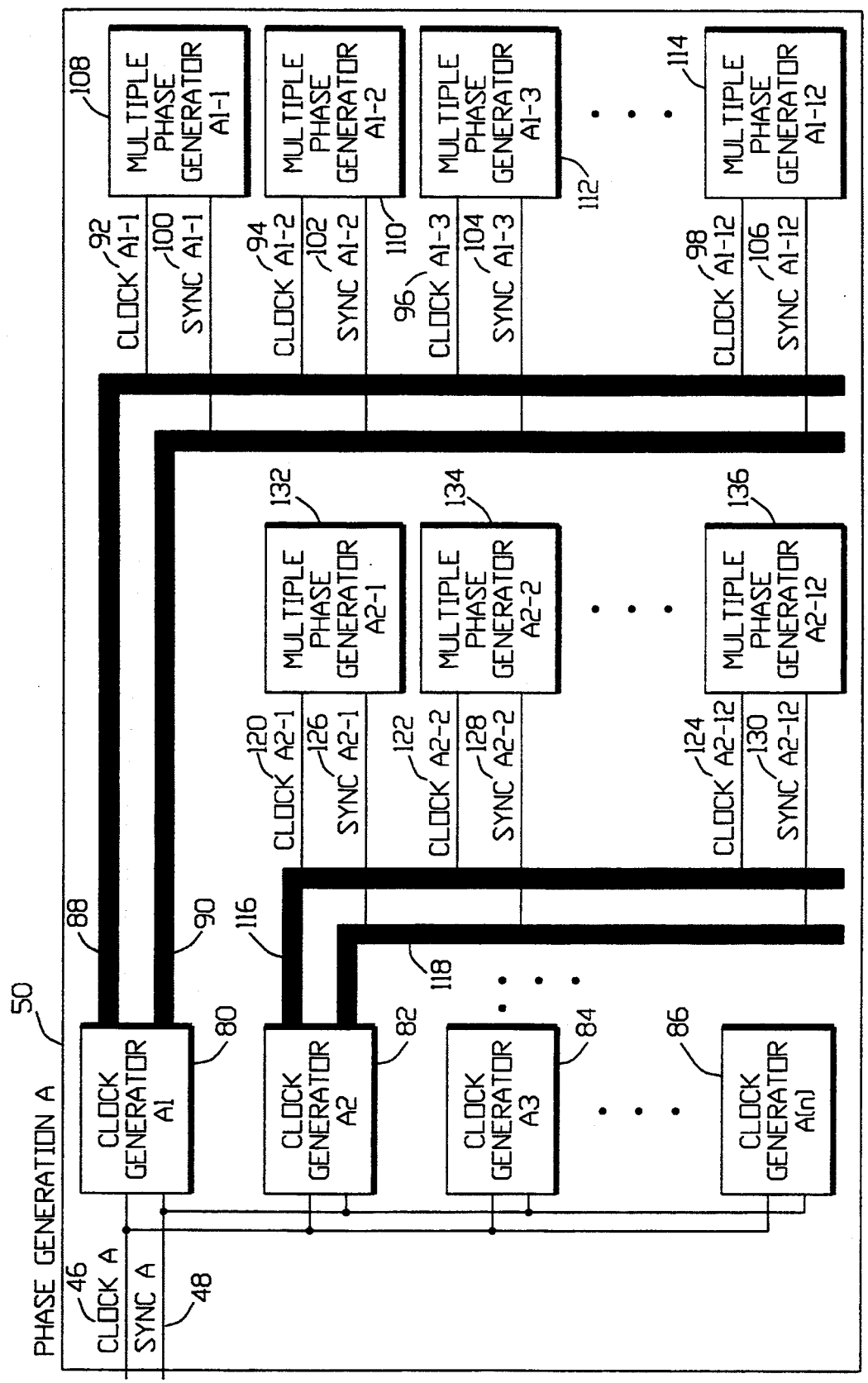
FIG. 5 is a block diagram of the major segments of Phase Generation A.

FIG. 5 is a block diagram of the major segments of Phase Generation A 50. The internal elements of Phase Generation B 54 and any further Phase Generation circuits are identical to that of Phase Generation A. Therefore, only Phase Generation A will be discussed, and the description to additional Phase Generation circuits are analogous to the discussion hereafter.

Clock A 46 and Sync A 48 enter Phase Generation A 50, and become inputs to Clock Generator A1 80, Clock Generator A2 82, Clock Generator A3 84 through Clock Generator A(n) 86. The Clock Generators provide the required clock signal fanout to their respective phase generators. Clock Generator A1 80 provides a clock and a synchronization signal to as many as twelve phase generators on Clock Bus A1 88 and Sync Bus A1 90. Clock Generator A1 80 therefore produces twelve clock signals on Clock Bus A1, labeled Clock A1-1 92, Clock A1-2 94, Clock A1-3 96, through Clock A1-12 98. Clock Generator A1 also fans out twelve synchronization signals on Sync Bus A1, labeled Sync A1-1 100, Sync A1-2 102, Sync A1-3 104, through Sync A1-12 106. Each Clock and Sync Signal is connected to its respective phase generator. For instance, Clock A1-1 92 and Sync A1-1 100 provide clocking for Multiple Phase Generator A1-1 108, Clock A1-2 94 and Sync A1-2 102 provide clocking for Multiple Phase Generator A1-2 110, Clock A1-3 96 and Sync A1-3 104 provide clocking for Multiple Phase Generator A1-3 112, and so forth through Multiple Phase Generator A1-12 114 which is supplied with Clock A1-12 98 and Sync A1-12 106.

Similarly, Clock Generator A2 82 provides clock and synchronization signals on Clock Bus A2 116 and Sync Bus A2 118 respectively. Clock Generator A2 82 produces twelve clock signals on Clock Bus A2, labeled Clock A2-1 120, Clock A2-2 122, through Clock A2-12 124. Clock Generator A2 also fans out twelve synchronization signals on Sync Bus A2, labeled Sync A2-1 1 126, Sync A2-2 128, through Sync A2-12 130. Each Clock and Sync Signal is connected to its respective phase generator so that Clock A2-1 120 and Sync A2-1 126 provide clocking for Multiple Phase Generator A2-1 132, Clock A2-2 122 and Sync A2-2 128 provide clocking for Multiple Phase Generator A2-2 134, and so forth through Multiple Phase Generator A2-12 136 which is supplied with Clock A2-12 124 and Sync A2-12 130.

It can be seen that a similar scenario would exist where further Multiple Phase Generators were necessary, and were provided clock and synchronization signals through Clock Generator A3 84 through Clock Generator A(n) 86. Each Clock Generator can supply clock and synchronization signals for up to twelve Multiple Phase Generators. In the preferred embodiment of the invention, Clock Generators A2 82 through A(n) 86 were not required, and therefore only Clock Generator A1 80 is used.

Each of the Multiple Phase Generators in the preferred embodiment includes circuitry to produce multiple phase enable signals, and includes fan-out capabilities to supply load circuitry with multiple phase enables signals. The load circuitry consists of components such as flip-flops and registers, and is the ultimate recipient of the Clock signal and the enable signals. Each Multiple Phase Generator has fan-out capabilities to provide enable signals for many flip-flops. The reason for using numerous Multiple Phase Generators is to provide phase generation physically close to the recipient circuit loads to alleviate skew problems. In the preferred embodiment, a different Multiple Phase Generator resides in each gate array used in a group of printed circuit boards. The Multiple Phase Generators and the enable signals will be discussed in more detail in the description accompanying FIG. 6.

Figure 6:
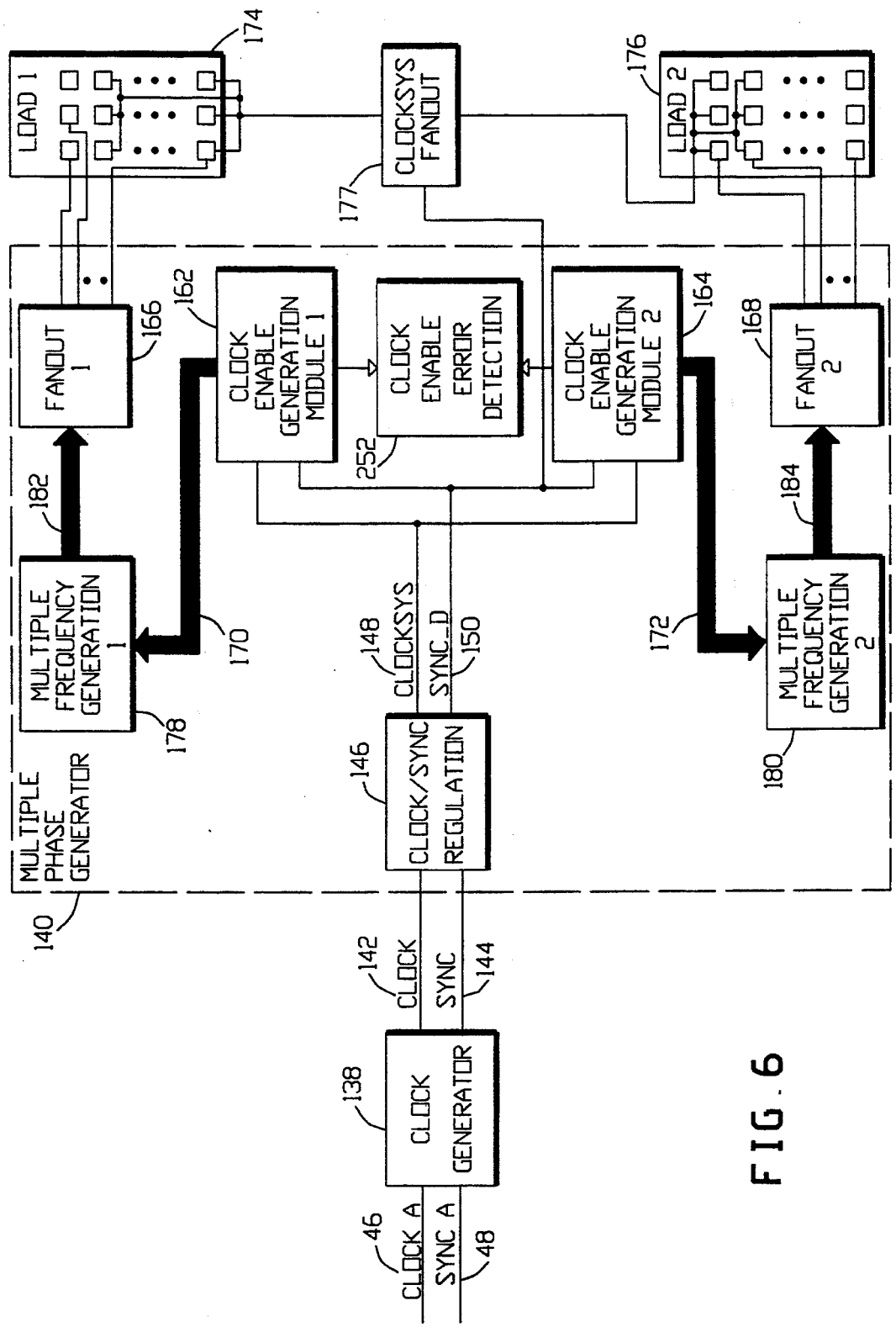
FIG. 6 shows the composition of the Multiple Phase Generators.

FIG. 6 shows the composition of the Multiple Phase Generators. Since all Clock Generators of FIG. 5 (A1 80, A2 82 . . . A(n) 86) consist of identical circuitry, and all Multiple Phase Generators (A1-1 108, A1-2 110, . . . A1-12 114, A2-1 132, A2-2 134, . . . A2-12 136, etc.) consist of identical circuitry, the remaining discussion will describe a generic Clock Generator, labeled Clock Generator 138, and a generic Multiple Phase Generator, labeled Multiple Phase Generator 140, rather than discuss each one individually. Therefore, it should be noted that the operation of each Clock Generator and Multiple Phase Generator in FIG. 5 may be described by analogy from the following description of the generic Clock Generator 138 and the generic Multiple Phase Generator 140.

Clock A 46 and Sync A 48 enter the Clock Generator which outputs Clock 142 and Sync 144, which in turn become the inputs to the Multiple Phase Generator 140. This interconnection was previously described in FIG. 5, as part of the description of Phase Generation A 50. The Clock/Sync Regulation 146 which receives Clock and Sync performs two functions. First, it receives the Clock 142 signal, inverts it, and outputs the signal Clocksys 148. Inversion of the Clock signal puts it in the necessary orientation to clock on a low-to-high transition during an active enable signal (discussed below). Second, the Clock/Sync Regulation receives the Sync signal, delays it, and outputs the signal Sync_D The Sync signal is delayed to avoid race conditions.

Figure 7:
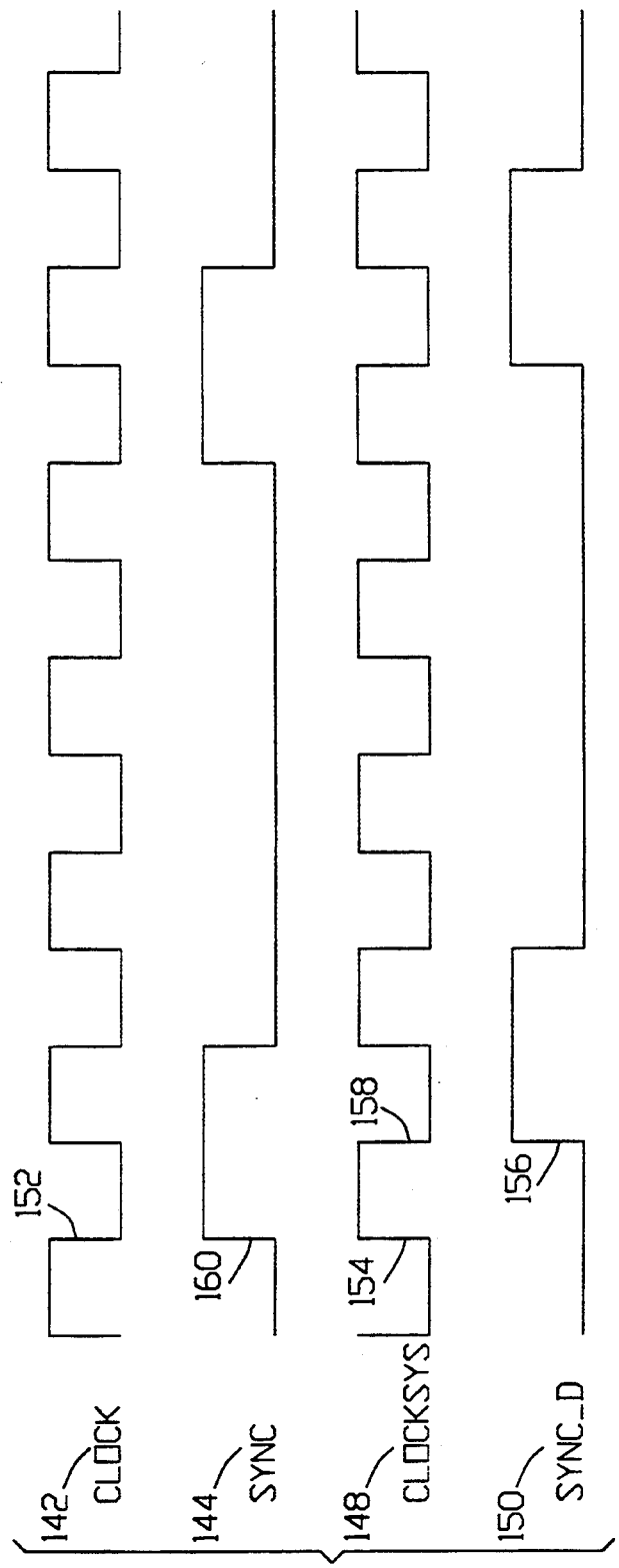
FIG. 7 is a waveform diagram of the inputs and outputs of the Clock/Sync Regulation in the Multiple Phase Generator.

FIG. 7 is a waveform diagram of the inputs and outputs of the Clock/Sync Regulation 146 in the Multiple Phase Generator 140. As previously described, the Clocksys 148 signal is the digitally inverted Clock 142 signal, so that a Clock Falling Edge 152 will occur at the same time as a Clocksys Rising Edge 154. The Sync_D 150 signal has the same frequency and duty cycle of the Sync 144 signal, but is delayed in time by one-half of one period of the Clock signal. A Sync_D Rising Edge 156 occurs at the same time as the first Falling Edge 158 of Clocksys that follows a Rising Edge 160 of the Sync signal. The inverted Clock 142 which produces Clocksys 148 makes it possible to delay the Sync 144 signal by one-half period of the Clock 142, and thus produces Sync_D 150.

Again referring to FIG. 6, the Clocksys 148 signal becomes the active clock for all of the loads associated with the Multiple Phase Generator 140. This signal is derived from a common system clock, i.e., Clock A 46 of FIG. 3 and FIG. 5, which is fanned out to each of the Multiple Phase Generators as shown in FIG. 5 as Clock A1-1 92, Clock A1-2 94, and so forth. The generated Clocksys 148 provides a clock signal to Clock Enable Generation Module 1 162, Clock Enable Generation Module 2 164, Fanout 1 166, and Fanout 2 168. Clocksys 148 equips the Clock Enable Generation Modules 1 162 and 2 164 with the clock signal necessary to produce enable signals, which are outputted from the Clock Enable Generation Modules 1 and 2 on Enable Bus 1 170 and Enable Bus 2 172. The Clock Enable Generation Modules and the resulting enable signals will be discussed in more detail in the discussion of FIG. 8 and FIG. 9.

Clocksys 148 is also provided to each of the recipient Loads 1 174 and 2 176 which require clock signals through Clocksys Fanout 177. Therefore, Clocksys provides the actual clock signal for each of the Loads (which consist of flip-flops, registers, etc.) which is driven by the Multiple Phase Generator 140. Although Clocksys will be available at each Load to perform clocking functions, it will not be allowed to actually clock the Loads unless an enable signal from Clock Enable Generation Module 1 162 or Clock Enable Generation Module 2 164 is present at the recipient Load.

Sync_D 150 is the delayed synchronization signal. It is input into Clock Enable Generation Module 1 162 and Clock Enable Generation Module 2 164, and is used to generate four enable signals on Enable Bus 1 170 and Enable Bus 2 172 respectively. The enable signals from Enable Bus 1 are inputted into the Multiple Frequency Generation 1 178, and the enable signals from Enable Bus 2 are inputted into the Multiple Frequency Generation 2 180. Multiple Frequency Generation 1 and 2 circuits produce variants of the enable signal frequencies, so that the clock-receiving flip-flops and registers at Loads 1 174 and 2 176 may be enabled at varying times. These varying frequency enable signals are provided to Fanout 1 166 and Fanout 2 168 on Multiple Frequency Enable Bus 1 182 and Multiple Frequency Enable Bus 2 184 respectively. A full discussion of the Multiple Frequency Generation circuits is discussed in the description accompanying FIG. 10.

Figure 8:
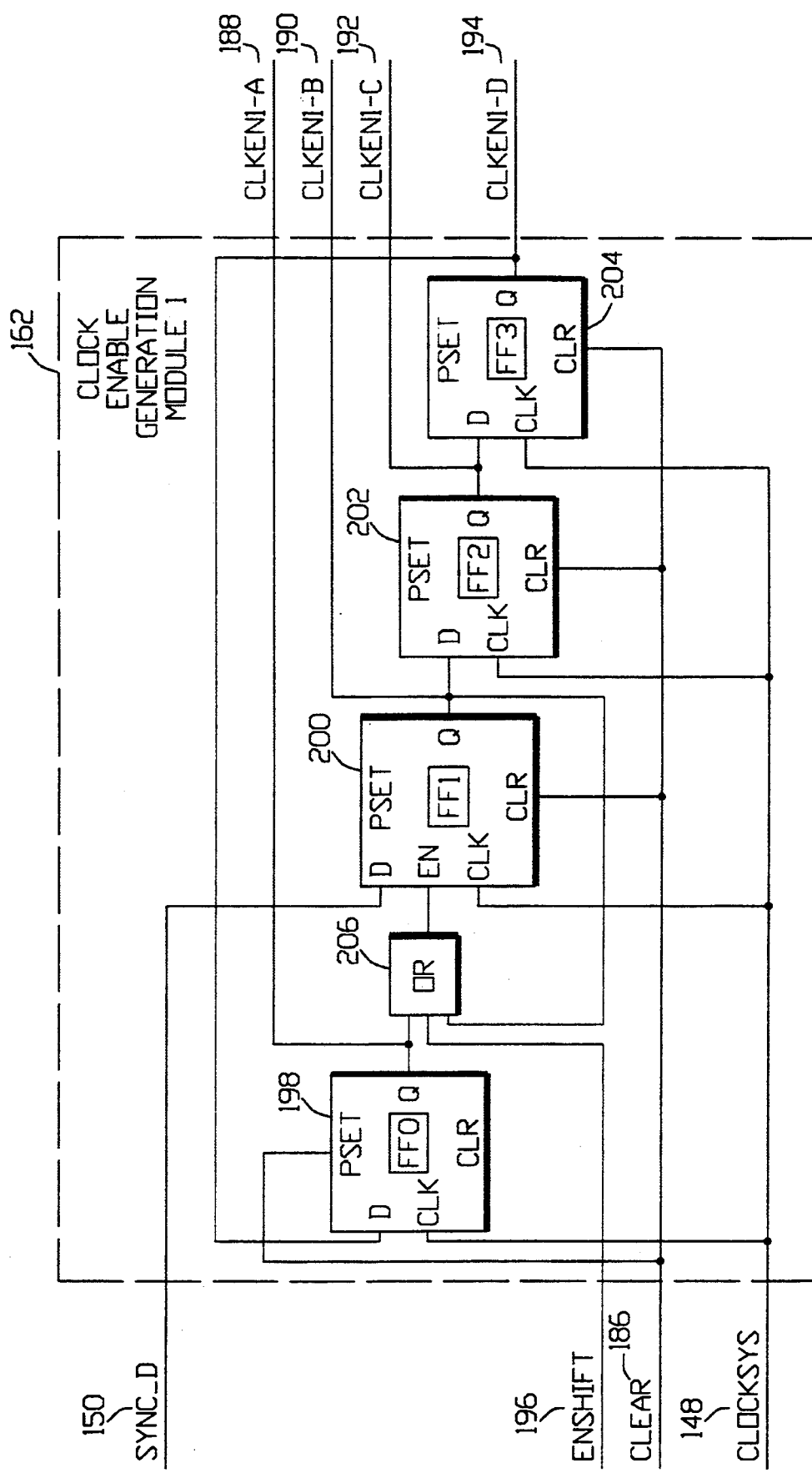
FIG. 8 shows the enable signal generation of the Clock Enable Generation Module 1.

FIG. 8 shows the enable signal generation of the Clock Enable Generation Module 1 162. The purpose of the Clock Enable Generation Modules is to produce four distinct phases of the Sync_D 150 signals, so that circuit loads may be enabled and disabled to receive the Clocksys 148 signal. Only Clock Enable Generation Module 1 162 will be discussed, as all Clock Enable Generation Modules are identical, and this discussion applies to each by analogy.

Figure 9:
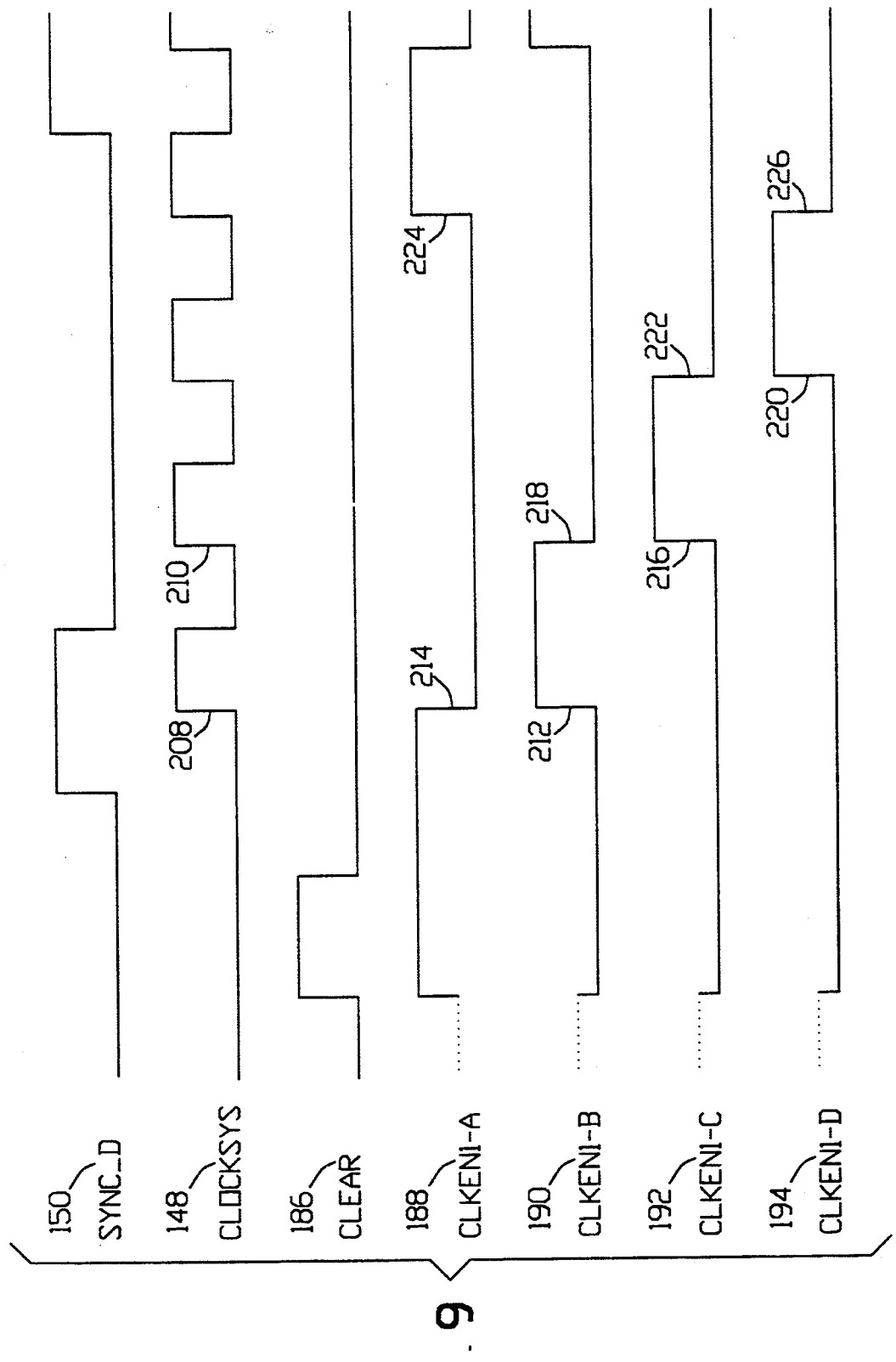
FIG. 9 shows the input and output waveforms of the Clock Enable Generation Module described in FIG. 8.

FIG. 9 shows the input and output waveforms of the Clock Enable Generation Module 1 162 described in FIG. 8. The waveform for inputs Sync_D 150, Clear 186, and Clocksys 148 are shown, as well as for outputs Clken1-A 188, Clken1-B 190, Clken1-C 192 and Clken1-D 194. These waveforms should be considered in conjunction with the following description regarding the Clock Enable Generation Module 1 162 in FIG. 8.

Referring again to FIG. 8, Clocksys 148 and Sync_D 150 are inputs to the Clock Enable Generation Module 1 162. Other inputs are Enshift 196 and Clear 186. The Clock Enable Generation Module 1 provides four outputs, labeled Clken1-A 188, Clken1-B 190, Clken1-C 192 and Clken1-D 194. The components within the Clock Enable Generation Module 1 include four D-type flip-flops, labeled FF0 198, FF1 200, FF2 202, and FF3 204, as well as an OR gate, labeled OR 206. The flip-flops are connected serially with feedback from the last flip-flop in the chain, FF3, to the first flip-flop in the chain, FF0. To initiate the sequence of events that produces the four-phase enable signals within this flip-flop chain, a Clear 186 signal must be issued. The Clear signal is connected to the PSET (preset) input of FF0 198, and to the CLR (clear) inputs of FF1 200, FF2 202, and FF3 204. This Clear signal will cause the Q output of FF0 to be set to a high logic level, and the Q outputs of FF1, FF2, and FF3 to reset to a low logic level. Therefore, at the rising edge of an active Clear signal, enable signal Clken1-A 188 will be set to a high logic level, and enable signals Clken1-B 190, Clken1-C 192, and Clken1-D 194 will be cleared to a low logic level, which can also be seen in FIG. 9. The high logic level present at the Q output of FF0 will produce a high logic level at the output of the OR 206 gate, which will cause the EN (enable) input of FF1 to go to a high logic level.

At this point, FF1 200 is enabled and ready to accept a Sync_D 150 signal at it's D input, and the next pulse of Sync_D will be applied to the D input, and clocked in on the next triggering edge of the FF1 CLK input. This results in the Q output of FF1 switching to a high logic level, and the Q output of FF0 198 will switch to a low logic level because it's D input is connected to Clken1-D 194 which was at a low logic level. The state of the system has now changed such that a logic low is outputted from the Q outputs of FF0 198, FF2 202, and FF3 204, and a logic high is outputted from the Q output of FF1 200. Accordingly, Clken1-A 188, Clken1-C 192, and Clken1-D 194 are also at a low logic level, and Clken1-B 190 is at a high logic level.

The Q output of FF1 200 is also fed back into OR 206, so that it can be inputted into the EN input of FF1. This is done so that FF1 can enable itself to clear it's Q output when the Sync_D 150 pulse has returned to a low logic level. Referring to FIG. 9, the Q output of FF1 and the Clken1-B 190 signal are set on the first rising clock Edge 208 of the Clocksys 148 signal when Sync_D 150 is at a high logic level, and the Q output of FF1 and the Clken1-B signal are cleared on the first rising Edge 210 of the Clocksys signal following the return of Sync_D to a low logic level. Therefore it is FF1 which determines the pulse width of the Clken1-A 188, Clken1-B 190, Clken1-C 192, and Clken1-D 194 enable signals.

FF2 202 and FF3 204 generate the remaining two enable signals, labeled Clken1-C 192 and Clken1-D 194 respectively. The Q output from FF1 200 is connected to the D input of FF2, and the Q output of FF2 produces the Clkenl-C enable signal. The Q output from FF2 is connected to the D input of FF3, and the Q output of FF3 produces the Clken1-D enable signal. The Q output from FF3 is fed back into the D input of FF0 198 to complete the cycle. As can be seen from FIG. 9, each enable signal will continuously cycle in a manner such that the rising Edge 212 of Clken1-B 190 coincides with the falling Edge 214 of Clken1-A 188, the rising Edge 9-16 of Clken1-C 192 coincides with the falling Edge 218 of Clken1-B 190, the rising Edge 220 of Clken1-D 194 coincides with the falling Edge 222 of Clken1-C 192, and the rising Edge 224 of Clken1-A 188 coincides with the falling Edge 226 of Clken1-D 194. FF1 200 does not receive it's D input from the output of another flip-flop, but receives it's D input from the Sync_D 150 signal. Therefore, once the timing chain has been initiated by a Clear 186 signal and Sync_D is properly functioning, the chain will continue as long as Sync_D remains present at the D input of FF1 and the Clocksys 148 signal continues to clock the flip-flops.

The Enshift 196 signal is an input to the OR 206 gate, as seen in FIG. 8. This signal provides a path to manually initiate the timing chain at any time, and can be used to reset the timing chain for testing purposes, or to reset the existing data in the flip-flops. The Enshift signal differs from the Clear 186 signal in that the Clear signal is automatically issued upon power up of the circuitry, and the Enshift signal may be manually activated at any time.

Figure 10:
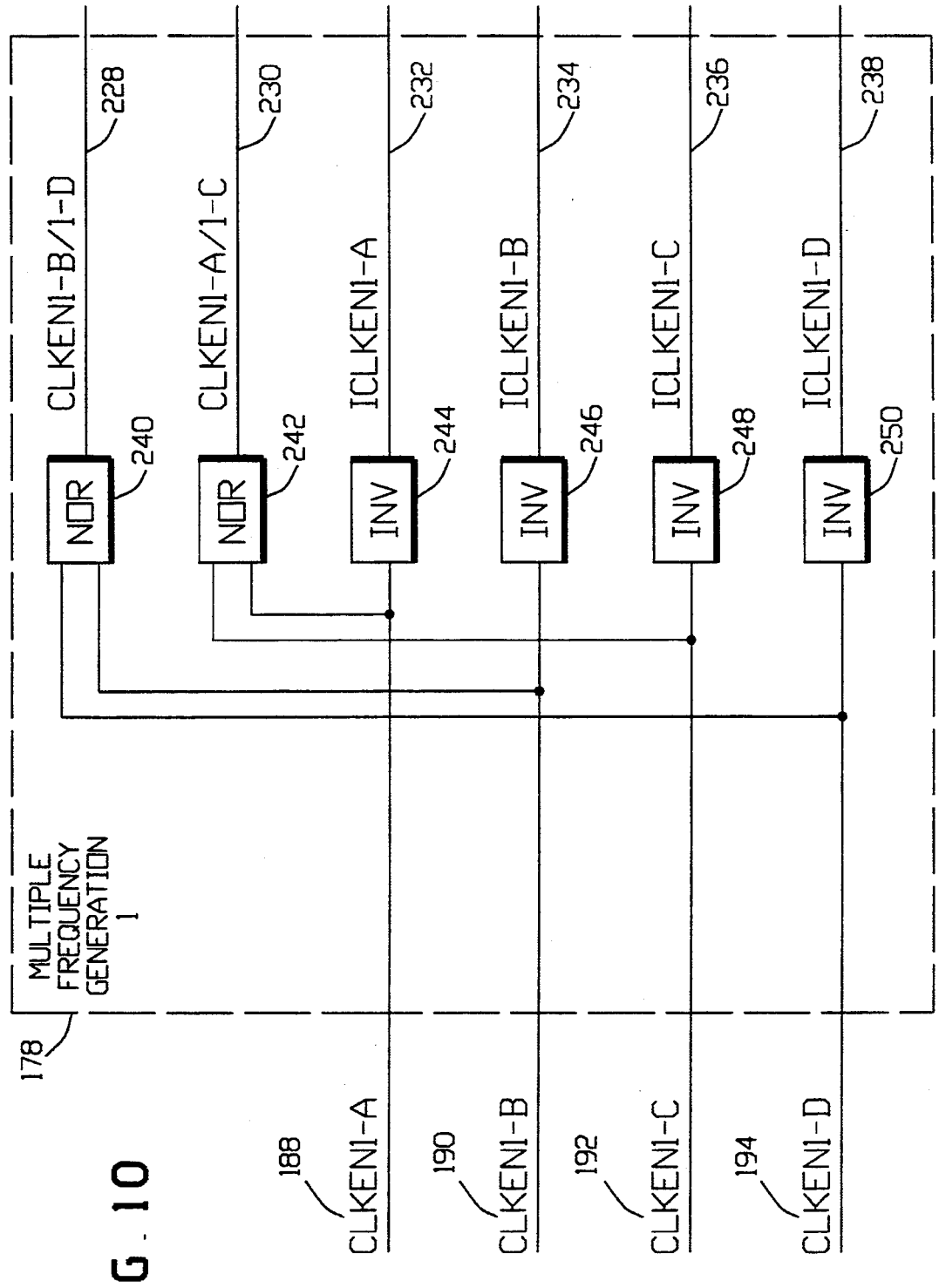
FIG. 10 is a block diagram of the Multiple Frequency Generation 1 circuitry.

FIG. 10 is a block diagram of the Multiple Frequency Generation 1 178 circuitry. The Multiple Frequency Generation circuitry provides a relatively skew-free method of allowing a circuit load to be clocked on one of the four phases, two of the four phases, or on all four of the four phases of the system clock. In a system that produces multiple phase clock signals which clock the circuit loads directly, individual phases could be combined by using an OR function to allow any combination of the clock phases to clock a circuit load. However, this would introduce additional skew. In the present system of using multiple phase "enable" signals, skew concerns are greatly reduced, since the enable signal itself is not clocking the circuit load, but rather only enables the common clock signal to clock the load. Therefore, combining enable signals to produce variations of enable signal frequencies also evades skew concerns.

In the preferred embodiment, a four-phase enable signal is used. These four phases enter the Multiple Frequency Generation 1 178 circuit to provide six output signals, labeled Clken1-B/1-D 228, Clken1-A/1-C 230, IClken1-A 232, IClken1-B 234, IClken1-C 236, and IClken1-D 238. Clken1-B and Clken1-D are combined through NOR 240 to produce Clken1-B/1-D. Clken1-A and Clken1-C are combined through NOR 242 to produce Clken1-A/1-C. IClken1-A, IClken1-B, IClken1-C, and IClken1-D are generated by inverting Clken1-A, Clken1-B, Clken1-C, and Clken1-D through INV 244, INV 246, INV 248, and INV 250 respectively. Both NOR gates and the inverters are used to drive the signals due to the speed of negative logic, and these signals are then later inverted to produce active high enable signals and combined enable signals.

Figure 11:
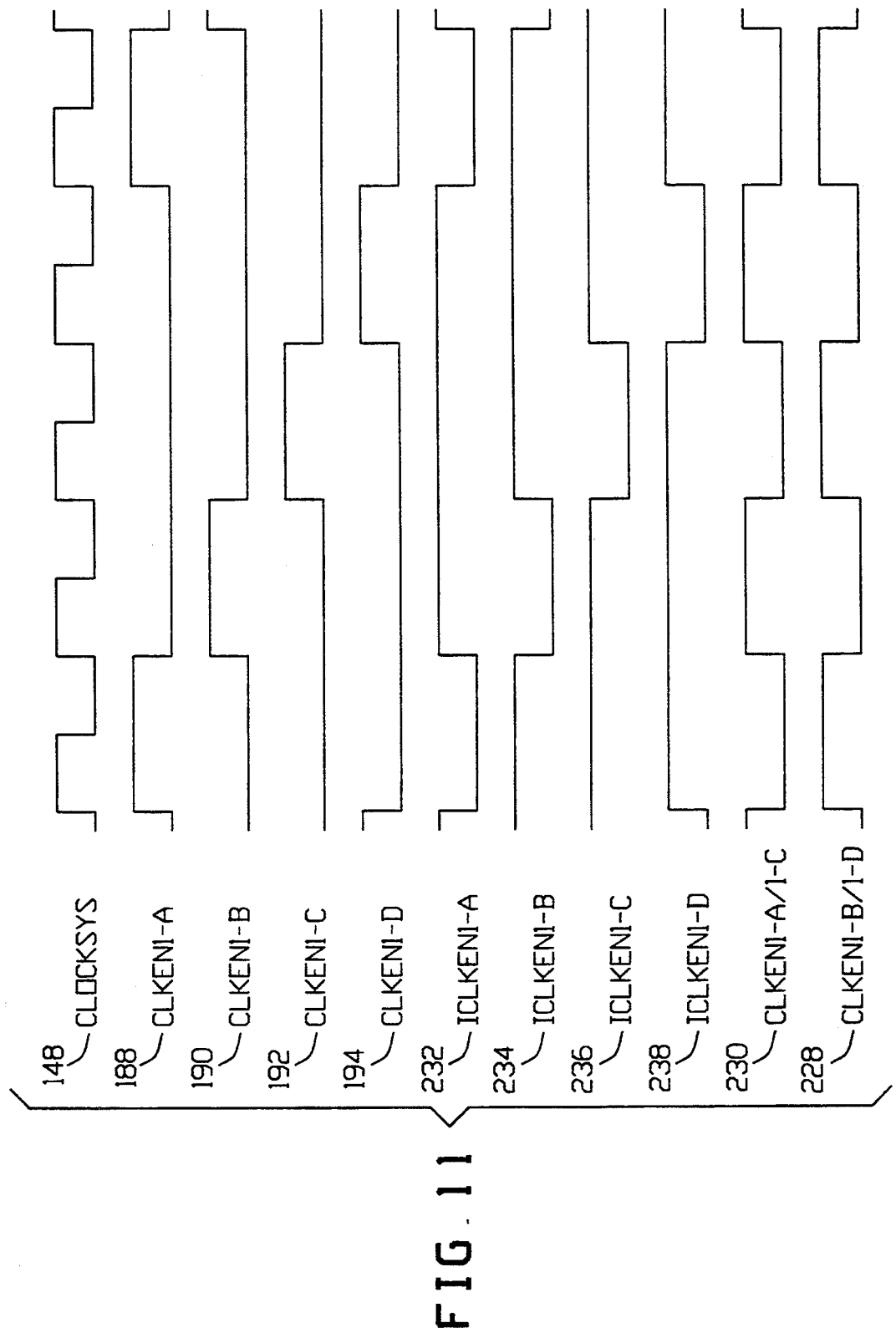
FIG. 11 is a waveform diagram of the inputs and outputs of a Multiple Frequency Generation circuit.

FIG. 11 is a waveform diagram of the inputs and outputs of a Multiple Frequency Generation circuit. It can be seen that IClken1-A 232, IClken1-B 234, IClken1-C 236, and IClken1-D 238 are logical inversions of Clken1-A 188, Clken1-B 190, Clken1-C 192, and Clken1-D 194 respectively. It can further be seen that Clken1-A/1-C 230 is the logical inversion of the result of the Clken1-A 188 OR the Clken1-C 192 signals, so that Clken1-A/1-C is at a low logic level (active level) when either Clken1-A or Clken1-C is at a high logic level. Similarly, Clken1-B/1-D 228 is the logical inversion of the result of the Clken1-B 190 OR the Clken1-D 194 signals, so that Clken1-B/1-D is at a low logic level (active level) when either Clken1-B or Clken1-D is at a high logic level.

IClken1-A 232, IClken1-B 234, IClken1-C 236, and IClken1-D 238 can each be connected to circuit loads requiring enable signals on every fourth cycle of the Clocksys 148 signal. As can be seen in FIG. 11, any one of these signals will generate an enable signal centered on every fourth pulse of the Clocksys signal. If it is desired to enable Clocksys to clock a circuit load on every other pulse of the Clocksys signal, either Clken1-

B/1-D 228 or Clken1-A/1-C 230 could be used. Combining two enable signals in this manner has the effect of having not only a four-phase enable generator, but also a two-phase enable generator. For circuit loads which require clocking on every pulse of the Clocksys 148 signal, the enable input on such circuit loads can simply be tied to the appropriate logic level in order to permanently enable the load to receive each of the pulses of the Clocksys signal. It would be unnecessary to use an OR function to combine all four of the enable signals in such a case, since a permanent enable signal will have the same result.

The Multiple Frequency Generation 1 178 of FIG. 10 allows an n-phase enable generator, where n is any integer greater than one, to emulate an m-phase enable generator, where m is any integer less than or equal to n. In the preferred embodiment, n equals four, and m equals two and one. Where m equals four, the Multiple Frequency Generation 1 178 and 2 180 are emulating the full n-phase enable generator by simply passing the n enable signals to Fanout 1 166 and 2 168 without performing any OR functions. In the preferred embodiment, the Multiple Frequency Generations simply perform an inversion of the enable signals to place the signals in the proper active logic state. Where m equals two, the Multiple Frequency Generation 1 178 is emulating a two-phase enable generator, producing the two phases Clken1-A/1-C 230 and Clken1-B/1-D 228. Where m equals one, the Multiple Phase Generator is allowing each of the phases of Clocksys 148 to be recognized. As previously stated, it is unnecessary to OR the n phases (four in the preferred embodiment) to produce a one-phase enable generator, since permanently enabling the circuit load's enable input would have the same effect as performing an OR function on all n phases and then connecting to the circuit load's enable input.

Although the preferred embodiment utilized a four-phase enable generator, it should be recognized that any number of phases could be used, and the Multiple Frequency Generation 1 178 and 2 180 circuits could be expanded to include more NOR gates, with varying numbers of inputs to the NOR gates, to combine the individual enable signals to produce varying combinations of enable signal frequencies. Since these are combinations of enable signals rather than combinations of the actual clocking signals, skew concerns are greatly diminished, since it is the presence of the enable signal logic level which is important, and not the rising or falling "edge" of the enable signal. The enable signals or combinations of the enable signals will be fully stabilized by the time the Clocksys 148 triggering edge is activated.

Figure 12:
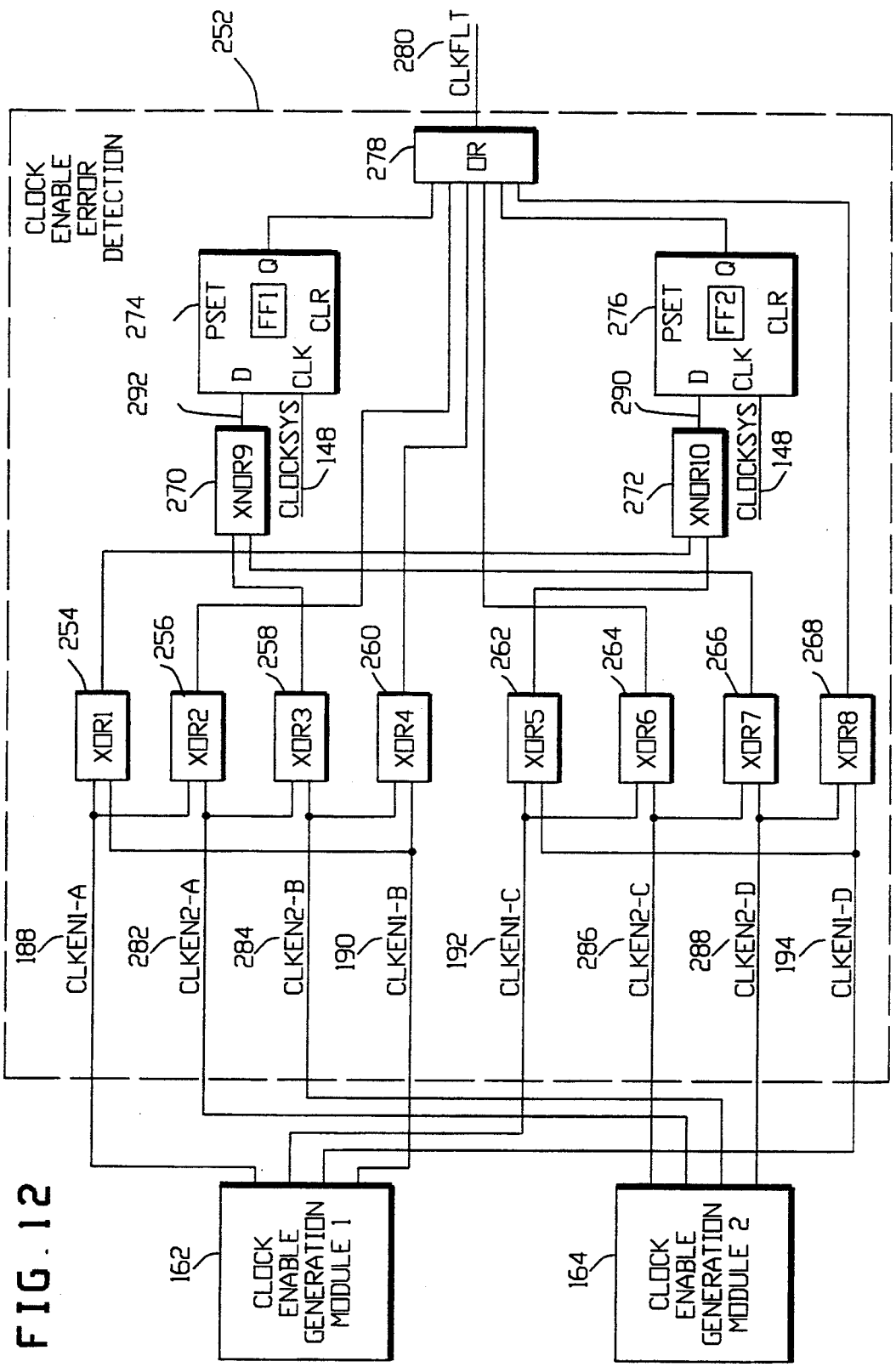
FIG. 12 shows the Clock Enable Error Detection within the Multiple Phase Generator.

FIG. 12 shows the Clock Enable Error Detection 252 within the Multiple Phase Generator 140. As shown in FIG. 6, the Clock Enable Error Detection is connected to each of the Clock Enable Generation Modules 1 162 and 2 164 in the Multiple Phase Generator. The Clock Enable Error Detection circuitry is comprised of eight exclusive-or gates, labeled XOR1 254, XOR2 256, XOR3 258, XOR4 260, XOR5 262, XOR6 264, XOR7 266, and XOR8 268, two exclusive-nor gates, labeled XNOR9 270, and XNOR10 272, two D-type flip-flops, labeled FF1 274 and FF2 276, and an OR gate, labeled OR 278. The exclusive-nor gates XNOR9 and XNOR10 are exclusive-or gates with an inverted output.

The Clock Enable Error Detection 252 circuitry tests for proper timing chain operation using two tests. If either of the two tests fail, a single clock fault labeled Clkflt 280 will result. A Clkflt will indicate to the system that a fault has occurred. The first test, the Enable Signal Set Test, checks to see if none of the enable signals within a Clock Enable Generation Module 1 162 or 2 164 are set, or if one of the enable signals is set when it should not be set. One, and only one, of the enable signals should be set at any given time. In Clock Enable Generation Module 1 162, this test is performed on enable signals Clken1-A 188, Clken1-B 190, Clken1-C 192, and Clken1-D 194. In Clock Enable Generation Module 2 164, this test is performed on enable signals Clken2-A 282, Clken2-B 284, Clken2-C 286, and Clken2-D 288. To perform this test, a parity check is executed on all of the enable signals generated within one Clock Enable Generation Module. For instance, a parity check is performed on enable signals Clken1-A 188, Clken1-B 190, Clken1-C 192, and Clken1-D 194 of Clock Enable Generation Module 1 162. This is accomplished by inputting Clken1-A and Clken1-B into XOR1 254, and inputting Clken1-C and Clken1-D into XOR5 262. The outputs of XOR1 and XOR5 are then inputted into XNOR10 272 in which the output is clocked into FF2 276 at the next rising edge of Clocksys 148. The output of FF2 is connected to OR 278 to produce a logic high on signal Clkflt 280 if a fault occurs. Similarly, a parity check is performed on enable signals Clken2-A 282, Clken2-B 284, Clken2-C 286, and Clken2-D 288 of Clock Enable Generation Module 2 164. This is accomplished by inputting Clken2-A and Clken2-B into XOR3 258, and inputting Clken2-C and Clken2-D into XOR7 266. The outputs of XOR3 and XOR7 are then inputted into XNOR9 270 in which the output is clocked into FF1 274 at the next rising edge of Clocksys 148. The output of FF1 is connected to OR 278 to produce a logic high on signal Clkflt 280 if a fault occurs.

A Clkflt 280 will occur if none of the enable signals are set, or if one of the enable signals is set when it should not be set. The Enable Signal Set Test will not detect when more than one of the flip-flops which should not be set is set, but the sequential nature of the timing chain is such that multiple failures of the flip-flops will be detected, since a single pulse is cycled through each of the flip-flops on each occurrence of the Clocksys 148 signal, and a single failure should be detected before multiple failures occur.

FIG. 13 is a table showing scenarios which will cause a Clkflt 280 to occur in Clock Enable Generation Module 1 162 during an Enable Signal Set Test. Recognizing that this test will not detect when more than one of the flip-flops which should not be set is set, FIG. 13 shows eleven possible enable signal patterns which may occur on Clken1-A 188, Clken1-B 190, Clken1-C 192, and Clken1-D 194. Only one of these enable signals should be set at any given time, and the XNOR10 Output 290 of XNOR10 272 is dependent upon the states of the enable signals. The XNOR10 Output can be easily determined by a person skilled in the art by analyzing FIG. 12. When the XNOR10 Output is at a logic level "0", then only one of the four enable signals is present, which indicates that no Clkflt error has occurred, and the Clkflt is in an inactive state. When the XNOR10 Output is at a logic level "1", then no enable signal is set when one should be set, or two enable signals are set at the same time. This indicates that a Clkflt error has occurred, and the Clkflt is in an active state.

FIG. 14 is a table showing scenarios which will cause a Clkflt 280 to occur in Clock Enable Generation Module 2 during an Enable Signal Set Test. As was true for Clock Enable Generation Module 1 162, there are eleven possible enable signal patterns which may occur in Clock Enable Generation Module 2 on enable signals Clken2-A 282, Clken2-B 284, Clken2-C 286, and Clken2-D 288. Only one of these enable signals should be set at any given time, and the XNOR9 Output 292 of XNOR9 270 is dependent upon the states of the enable signals. The output state of XNOR9 can be easily determinedby a person skilled in the art by analyzing FIG. 12. When the XNOR9 Output is at a logic level "0", then only one of the four enable signals is present, which indicates that no Clkflt 280 error has occurred, and the Clkflt 280 is in an inactive state. When the XNOR9 Output is at a logic level "1", then no enable signal is set when one should be set, or two enable signals are set at the same time. This indicates that a Clkflt error has occurred, and the Clkflt is in an active state.

The second test, the Enable Signal Comparison Test, checks to see that like phases of the enable signals in each of the Clock Enable Generation Modules 1 162 and 2 164 are occurring simultaneously. Two Clock Enable Generation Modules were used in the preferred embodiment in order to accommodate the fanout requirements of the system and to reduce accumulative skew effects. To ensure that Load 1 174 and Load 2 176 of FIG. 6 are receiving synchronized phases of the enable signals, each individual phase of the enable signals from Clock Enable Generation Module 1 162 must be monitored to ensure that it is active at the same time as the enable signals from Clock Enable Generation Module 2 164. Therefore, a comparison of correlating phases Clkenl-A 188 and Clken2-A 282 using XOR2 256 will be performed, as well as a comparison of Clkenl-B 190 and Clken2-B 284 using XOR4 260, a comparison of Clkenl-C 192 and Clken2-C 286 using XOR6 264, and a comparison of Clkenl-D 194 and Clken2-D 288 using XOR8 268. By using an exclusive-or gate to compare each of the four correlating phases in the Clock Enable Generation Modules, it can be determined whether a phase in Clock Enable Generation Module 1 162 is at a different logic level as the correlating phase in Clock Enable Generation Module 2 164. If the correlating phases are at different logic levels, the associated exclusive-or gate will output a high logic level to the OR 278 gate, which will cause the Clkflt 280 error signal to become active.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. A multiple phase clock distribution system for use in a system having a synchronization signal occurring on every n-th pulse of a digital clock signal where n is a whole number, and for enabling circuit loads to be clocked on specified phases of the digital clock signal, comprising:

clock sourcing circuitry for generating the digital clock signal and the synchronization signal;

phase enabling generation circuitry coupled to said clock sourcing circuit for receiving the synchronization signal, and for generating a plurality of enable signals; and a plurality of circuit loads, each coupled to said clock sourcing circuitry and to said phase enabling generation circuitry, and comprising a clock signal input for receiving the digital clock signal, and further comprising one or more enable signal inputs for receiving an equivalent number of said enable signals for enabling said circuit loads to be clocked by the digital clock signal upon receipt of a predetermined logic level ono said enable signals.

2. The multiple phase clock distribution system as in claim 1, further comprising enable signal combination circuitry coupled to said phase enabling generation circuitry, for combining selected ones of said enable signals to produce variations of frequencies of said enable signals to be received at said enable signal inputs of said circuit loads, whereby said circuit loads are allowed to be clocked by the digital clock signal at different frequencies than that of individual ones of said enable signals.

3. The multiple phase clock distribution system as in claim 1, wherein:

each said enable signal generated by said phase enabling generation circuitry transitions to an active logic level for a duration equal to one period of the digital clock signal; and wherein each said enable signal transitions to an active logic level every m-th pulse of the digital clock signal, where m equals the number of said enable signals generated by said phase enabling generation circuitry; and wherein each said enable signal transitions to an active logic level at a time when no other said enable signal transitions to an active logic level.

4. The multiple phase clock distribution system as in claim 3, wherein each said enable signal of duration equal to one period of the digital clock signal is activated at a time nearly one period of the digital clock signal before the active triggering edge of the digital clock signal, whereby enable signal skew concerns are diminished as the enable signal need only be stabilized at the time the active triggering edge of the digital clock signal transitions.

5. The multiple phase clock distribution system as in claim 3, further comprising enable signal error detection circuitry coupled to said phase enabling generation circuitry, to monitor said enable signals and to generate an error signal in response to recognition of an untimely active or inactive logic level on said enable signals.

6. The multiple phase clock distribution system as in claim 5, wherein:

said enable signal error detection circuitry monitors said enable signals to ensure that each said enable signal transitions to an active logic level only on every m-th pulse of the digital clock signal, where m equals the number of said enable signals generated by said phase enabling generation circuitry; and wherein said enable signal error detection means monitors said enable signals to ensure that each said enable signal transitions to an active logic level at a time when no other said enable signal transitions to an active logic level.

7. The multiple phase clock distribution system as in claim 1, wherein the number of said enable signals generated by said phase enabling generation circuitry is four.

8. A multiple phase clock distribution system for use in a system having a synchronization signal occurring on every n-th pulse of a digital clock signal where n is a whole number, and for clocking one or more circuit loads on specified phases of the digital clock signal, comprising:

clock source means for generating the digital clock signal and the synchronization signal;

phase signal generating means, coupled to said clock source means, for receiving the synchronization signal, and for generating in response thereto a predetermined number of enable signals; and a plurality of phase enable means, each coupled to said phase signal generating means and each coupled to one of the circuit loads, for receiving said enable signals, and for allowing its associated circuit load to be clocked by the digital clock signal during each active logic level of one of said enable signals.

9. The multiple phase clock distribution system as in claim 8, further comprising enable signal combination means coupled to said phase signal generating means, for receiving said enable signals and combining selected ones of said enable signals to produce one or more combined enable signals, and for providing said combined enable signals to said phase signal generating means to allow its associated circuit load to be clocked by the digital clock signal during each active logic level of said combined enable signals.

10. The multiple phase clock distribution system as in claim 9, wherein each said combined enable signals transition to an active logic level during each active logic level of its respective selected ones of said enable signals received by said enable signal combination means.

11. The multiple phase clock distribution system as in claim 8, wherein:

each said enable signal generated by said phase signal generating means transitions to an active logic level for a duration equal to one period of the digital clock signal; and wherein each said enable signal transitions to an active logic level every m-th pulse of the digital clock signal, where m equals the number of said enable signals generated by said phase signal generating means; and wherein each said enable signal transitions to an active logic level at a time when no other said enable signal transitions to an active logic level.

12. The multiple phase clock distribution system as in claim 11, wherein each said enable signal of duration equal to one period of the digital clock signal is activated at a time nearly one period of the digital clock signal before the active triggering edge of the digital clock signal, whereby enable signal skew concerns are diminished as the enable signal need only be stabilized at the time the active triggering edge of the digital clock signal transitions.

13. The multiple phase clock distribution system as in claim 11, further comprising enable signal error detection means coupled to said phase signal generating means, for monitoring said enable signals and for generating an error signal upon recognition of an untimely active or inactive logic level on said enable signals.

14. The multiple phase clock distribution system as in claim 13, wherein:

said enable signal error detection means monitors said enable signals to ensure that each said enable signal transitions to an active logic level only on every m-th pulse of the digital clock signal, where m equals the number of said enable signals generated by said phase signal generating means; and wherein said enable signal error detection means monitors said enable signals to ensure that each said enable signal transitions to an active logic level at a time when no other said enable signal transitions to an active logic level.

15. The multiple phase clock distribution system as in claim 8, wherein said predetermined number of enable signals generated by said phase signal generating means is four.

16. A multiple phase clock generation circuit for use in a system having clock sourcing circuitry to provide a digital clock signal to each circuit load requiring digital clock pulses, and the system having clock enable circuitry on each of the circuit loads to enable the digital clock signal to clock the circuit load upon receipt of one or more enable control signals, and the system further having a synchronization signal occurring on every n-th pulse of the digital clock signal where n is a whole number, the multiple phase clock generation circuit comprising:

enable signal generation circuitry for receiving the synchronization signal and generating one or more enable signals;

enable signal combination circuitry coupled to said enable signal generation circuitry for receiving said enable signals and combining selected ones of said enable signals to produce a plurality of combined enable signals;

distribution circuitry coupled to said enable signal generation circuitry and said enable signal combination circuitry to receive said enable signals and said combined enable signals respectively, and to distribute selected ones of said enable signals and said combined enable signals as the enable control signals to the circuit loads; and error detection circuitry coupled to said enable signal generation circuitry to provide an error indication upon recognition of an untimely active or inactive logic level on said enable signals.

17. The multiple phase clock generation circuit as in claim 16, wherein said enable signal generation circuitry comprises a plurality of flip-flops connected in series, the first said flip-flop receiving the synchronization signal as its data input, and each of the remaining said flip-flops receiving the output of the previous said flip-flop in the series as its data input, and the output of each of said flip-flops providing one of said enable signals, whereby the first said flip-flop provides an output pulse equivalent in duration to the synchronization signal, and said output pulse is cycled through said plurality of flip-flops such that one active enable signal is produced at the output of one of said flip-flops on each consecutive pulse of the digital clock signal.

18. The multiple phase clock generation circuit as in claim 16, wherein said enable signal combination circuitry comprises logic circuitry to provide active logic levels on said combined enable signals upon the occurrence of an active logic level on any of said selected ones of said enable signals.

19. A multiple phase clock generation circuit for use in a system having clock sourcing circuitry to provide a digital clock signal to each circuit load requiring digital clock pulses, and the system having clock enable circuitry on each of the circuit loads to enable the digital clock signal to clock the circuit load upon receipt of one or more enable control signals, and the system further having a synchronization signal occurring on every n-th pulse of the digital clock signal where n is a whole number, the multiple phase clock generation circuit comprising:

enable signal generation means for receiving the synchronization signal and generating one or more enable signals;

enable signal combination means coupled to said enable signal generation means for receiving said enable signals and for combining selected ones of said enable signals to produce a plurality of combined enable signals;

distribution means coupled to said enable signal generation means and said enable signal combination means for receiving said enable signals and said combined enable signals respectively, and for distributing selected ones of said enable signals and said combined enable signals as the enable control signals to the circuit loads; and error detection means coupled to said enable signal generation means for providing an error indication upon recognition of an untimely active or inactive logic level on said enable signals.

20. The multiple phase clock generation circuit as in claim 19, wherein said enable signal generation means comprises a plurality of flip-flops connected in series, the first said flip-flop receiving the synchronization signal as its data input, and each of the remaining said flip-flops receiving the output of the previous said flip-flop in the series as its data input, and the output of each of said flip-flops providing one of said enable signals, whereby the first said flip-flop provides an output pulse equivalent in duration to the synchronization signal, and said output pulse is cycled through said plurality of flip-flops such that one active enable signal is produced at the output of one of said flip-flops on each consecutive pulse of the digital clock signal.

21. The multiple phase clock generation circuit as in claim 19, wherein said enable signal combination means comprises means for providing active logic levels on said combined enable signals upon the occurrence of an active logic level on any of said selected ones of said enable signals.

22. A method for clocking one or more circuit loads on specified phases of a digital clock signal in a system having a synchronization signal occurring on every n-th pulse of the digital clock signal where n is a whole number, the method comprising the steps of:

providing the digital clock signal to one or more of the circuit loads in the system;

generating a predetermined number of enable signals in response to the synchronization signal, each of said enable signals selectively having a first active level and a first inactive level; and enabling the circuit loads, in which the digital clock signal is provided, to acknowledge and be clocked by the digital clock signal when their associated ones of said predetermined number of enable signals are at said first active level.

23. The method as defined by claim 22, wherein said step of generating said predetermined number of enable signals is carried out such that only one of said predetermined number of enable signals is at said active level at any given time.

24. The method as defined by claim 22, which further comprises the steps of:

combining selected ones of said predetermined number of enable signals to produce one or more combined enable signals selectively having a second active level and a second inactive level, said combining occurring after having generated said predetermined number of enable signals; and enabling the circuit loads, in which the digital clock signal is provided, to acknowledge and be clocked by the digital clock signal when their associated ones of said combined enable signals are at said second active level.

25. The method as defined by claim 22, which further comprises the step of:

monitoring said predetermined number of enable signals for erroneous ones of said first and second active levels and said first and second inactive levels.

* * * * *